United States Patent
Harada et al.

(10) Patent No.: US 11,588,042 B2
(45) Date of Patent: Feb. 21, 2023

(54) SEMICONDUCTOR DEVICE

(71) Applicant: DENSO CORPORATION, Kariya (JP)

(72) Inventors: Shunsuke Harada, Kariya (JP); Takashi Nomura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/130,590

(22) Filed: Dec. 22, 2020

(65) Prior Publication Data

US 2021/0111275 A1   Apr. 15, 2021

Related U.S. Application Data

(63) Continuation of application No. PCT/JP2019/018394, filed on May 8, 2019.

(30) Foreign Application Priority Data

Jul. 4, 2018  (JP) .............. JP2018-127563

(51) Int. Cl.
*H01L 29/66* (2006.01)
*H01L 27/02* (2006.01)
*H01L 27/06* (2006.01)
*H01L 49/02* (2006.01)
*H01L 29/78* (2006.01)
*H01L 29/861* (2006.01)

(52) U.S. Cl.
CPC .... *H01L 29/66992* (2013.01); *H01L 27/0255* (2013.01); *H01L 27/0676* (2013.01); *H01L 28/40* (2013.01); *H01L 29/7804* (2013.01); *H01L 29/8611* (2013.01)

(58) Field of Classification Search
CPC .......... H01L 29/66992; H01L 27/0255; H01L 27/0676; H01L 28/40; H01L 29/7804; H01L 29/8611; H01L 23/34; H01L 27/0629; H01L 29/16; H01L 27/0733; H01L 29/861

See application file for complete search history.

(56) References Cited

U.S. PATENT DOCUMENTS

| | | | |
|---|---|---|---|
| 9,780,012 B2* | 10/2017 | Yao | H01L 27/0255 |
| 2002/0135037 A1* | 9/2002 | Tomomatsu | H01L 29/7395 257/E29.198 |
| 2008/0203389 A1 | 8/2008 | Ozoe et al. | |
| 2011/0012195 A1 | 1/2011 | Momota et al. | |
| 2015/0263144 A1 | 9/2015 | Misu et al. | |
| 2016/0241018 A1 | 8/2016 | Nakano | |
| 2016/0343700 A1* | 11/2016 | Nishimura | H01L 29/7808 |
| 2016/0365294 A1* | 12/2016 | Mori | H01L 22/30 |
| 2016/0372460 A1 | 12/2016 | Momota et al. | |
| 2019/0123044 A1 | 4/2019 | Nakano | |

* cited by examiner

*Primary Examiner* — Shouxiang Hu
(74) *Attorney, Agent, or Firm* — Posz Law Group, PLC

(57) ABSTRACT

A semiconductor device includes a semiconductor substrate, an insulating film disposed above the semiconductor substrate, a temperature detecting element disposed on the insulating film, and an anode side region and a cathode side region respectively located on an anode side and a cathode side of the temperature detecting element. The anode side region or the cathode side region includes one or more capacitance elements, and a sum of capacitance values of the capacitance elements is larger than a capacitance value of the temperature detecting element.

4 Claims, 8 Drawing Sheets

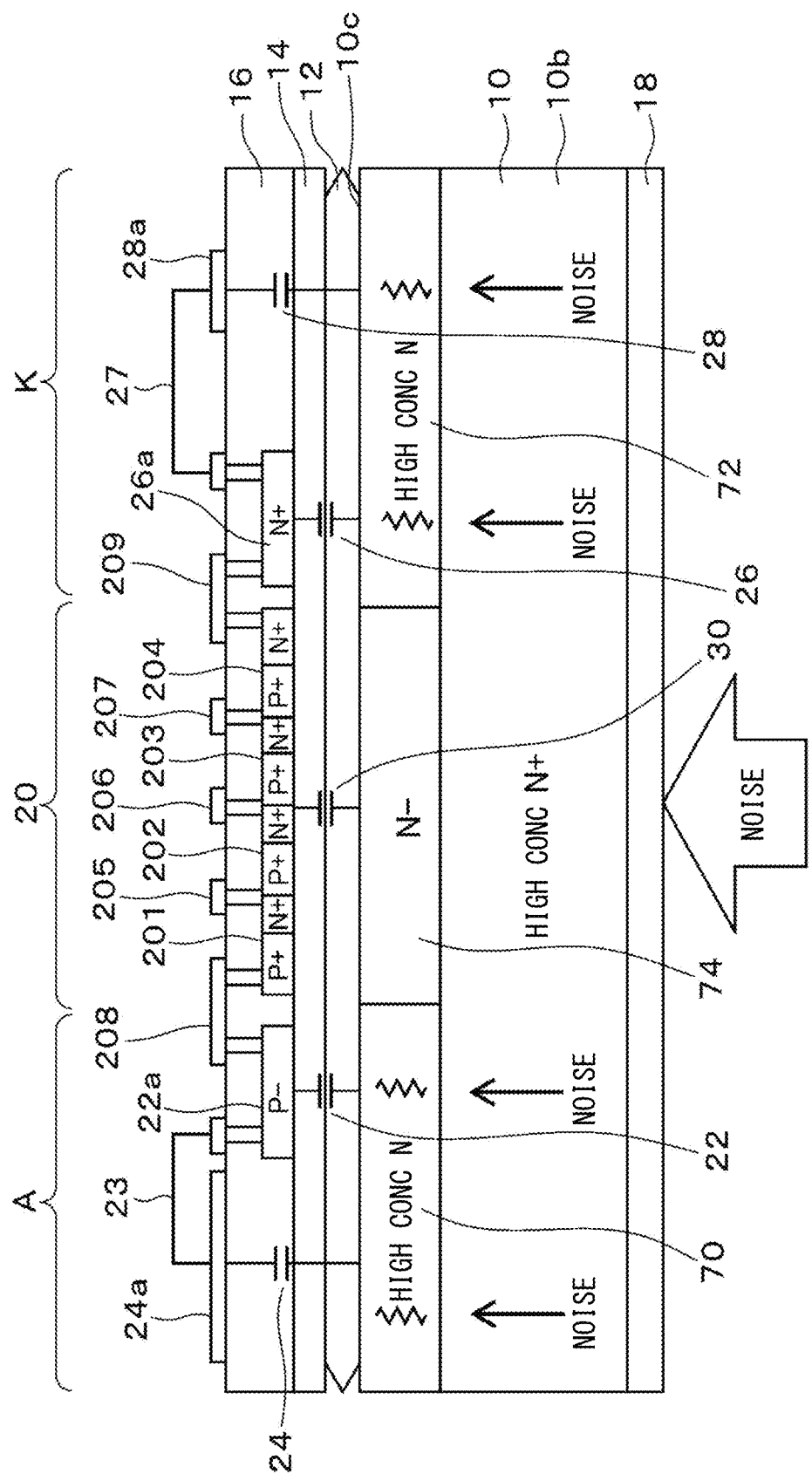

SEMICONDUCTOR DEVICE

CROSS REFERENCE TO RELATED APPLICATIONS

The present application is a continuation application of International Patent Application No. PCT/JP2019/018394 filed on May 8, 2019, which designated the U.S. and claims the benefit of priority from Japanese Patent Application No. 2018-127563 filed on Jul. 4, 2018. The entire disclosures of all of the above applications are incorporated herein by reference.

TECHNICAL FIELD

The present disclosure relates to a semiconductor device.

BACKGROUND

There has been known a technique in which a switching element and a temperature sensing diode are formed in a semiconductor substrate, and when an abnormality, such as flowing of overcurrent to the switching element, occurs and the switching element generates heat, the temperature sensing diode detects that to protect the switching element.

SUMMARY

The present disclosure provides a semiconductor device including a semiconductor substrate, an insulating film disposed on the semiconductor substrate, a temperature detecting element disposed on the insulating film, and an anode side region and a cathode side region respectively located on an anode side and a cathode side of the temperature detecting element.

According to one aspect of the present disclosure, the anode side region or the cathode side region includes one or more capacitance elements, and a sum of capacitance values of the capacitance elements is larger than a capacitance value of the temperature detecting element.

According another aspect of the present disclosure, a resistance value of the semiconductor substrate located under the anode side region or a resistance value of the semiconductor substrate located under the cathode side region is smaller than a resistance value of the semiconductor substrate located under the temperature detecting element.

According to another aspect of the present disclosure, an impedance under the anode side region or an impedance under the cathode side region is smaller than an impedance under the temperature detecting element.

BRIEF DESCRIPTION OF DRAWINGS

Objects, features and advantages of the present disclosure will become apparent from the following detailed description made with reference to the accompanying drawings. In the drawings:

FIG. 10 is a vertical cross-sectional view showing a schematic configuration of a temperature detecting element of a semiconductor device according to a fifth embodiment.

DETAILED DESCRIPTION

Figure 1:
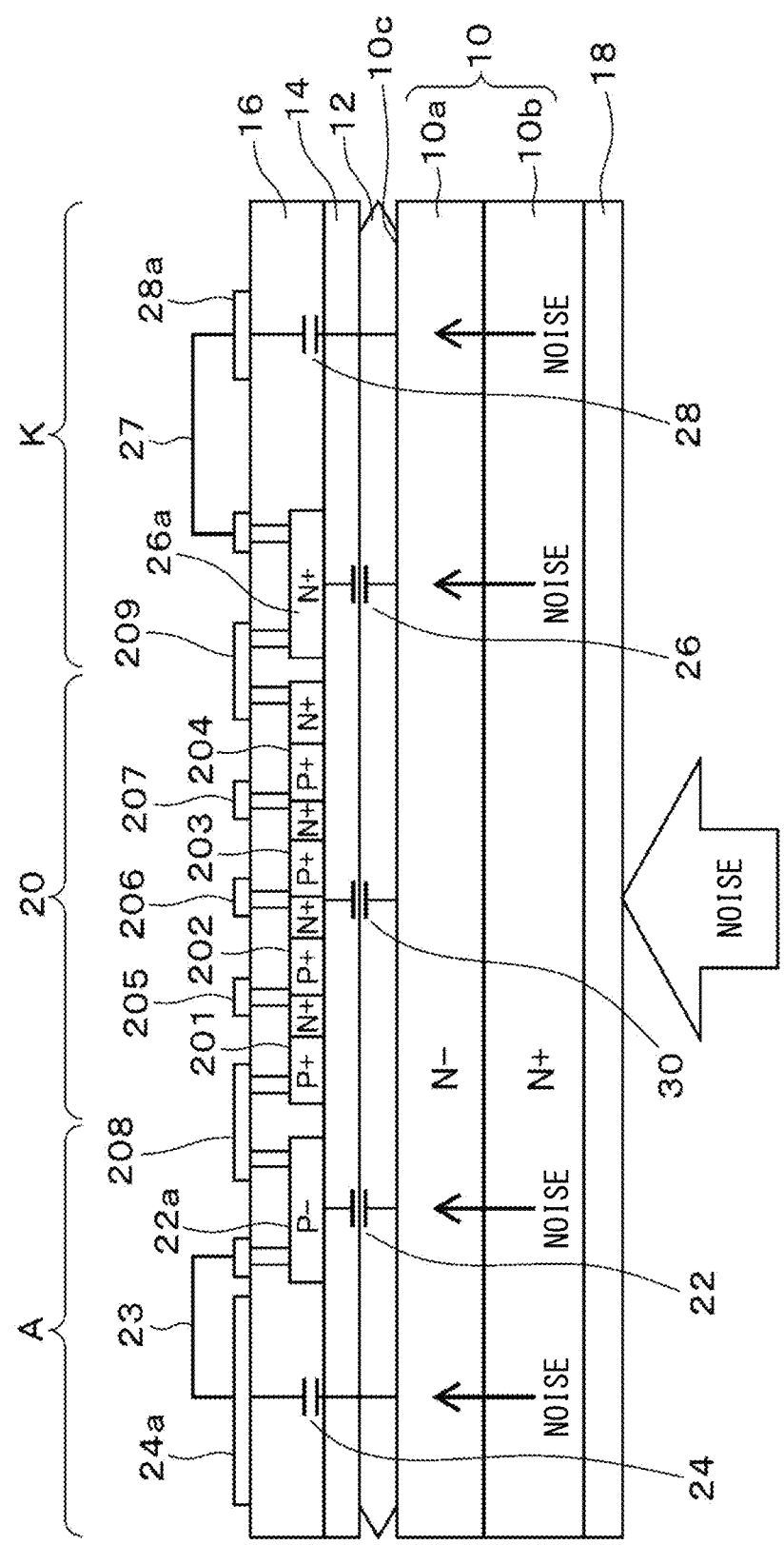
FIG. 1 is a vertical cross-sectional view showing a schematic configuration of a temperature detecting element of a semiconductor device according to a first embodiment.

In one configuration, a switching element is formed in a semiconductor substrate, and a temperature sensing diode having characteristics depending on temperature is provided on a front surface side of the semiconductor substrate to be independently from the switching element. When an abnormality, such as flowing of overcurrent to the switching element, occurs and the switching element generates heat, the temperature sensing diode detects that to protect the switching element.

However, in the above-described configuration, when noise enters from a rear surface side of the semiconductor substrate, the noise may be coupled with a capacitance directly under the temperature sensing diode, and Vf of the diode may fluctuate, which may cause erroneous operation.

According to one aspect of the present disclosure, a semiconductor device includes a semiconductor substrate, an insulating film disposed on the semiconductor substrate, a temperature detecting element disposed on the insulating film, and one or more capacitance elements disposed in an anode side region or a cathode side region. The anode side region is located on an anode side of the temperature detecting element and the cathode side region is located on a cathode side of the temperature detecting element. A sum of capacitance values of the capacitance elements in the anode side region or the cathode side region is larger than a capacitance value of the temperature detecting element.

With this configuration, the capacitance value under the anode side region or the cathode side region can be made larger than the capacitance value directly under the temperature detecting element. That is, an impedance directly under the anode side region or the cathode side region can be made small. Accordingly, noise propagated to the anode side region or the cathode side region is predominantly absorbed by the capacitance element provided in the anode side region or the cathode side region. As a result, noise input to the temperature detecting element can be reduced.

Hereinafter, a plurality of embodiments of the present disclosure will be described with reference to the drawings. In the following description, the same elements as those described above are designated by the same reference numerals, and the description thereof will be omitted. Further, in the following description and drawings, a p-type high concentration may be indicated by "p+", an n-type high concentration may be indicated by "n+", a p-type low concentration may be indicated by "p−", and an n-type low concentration may be indicated by "n−". For example, "p+region" means a p-type high concentration region. Further, in the following description, lowering the impedance includes increasing the capacitance value and lowering the resistance value, and increasing the capacitance value and lowering the resistance value means lowering the impedance.

First Embodiment

Figure 2:
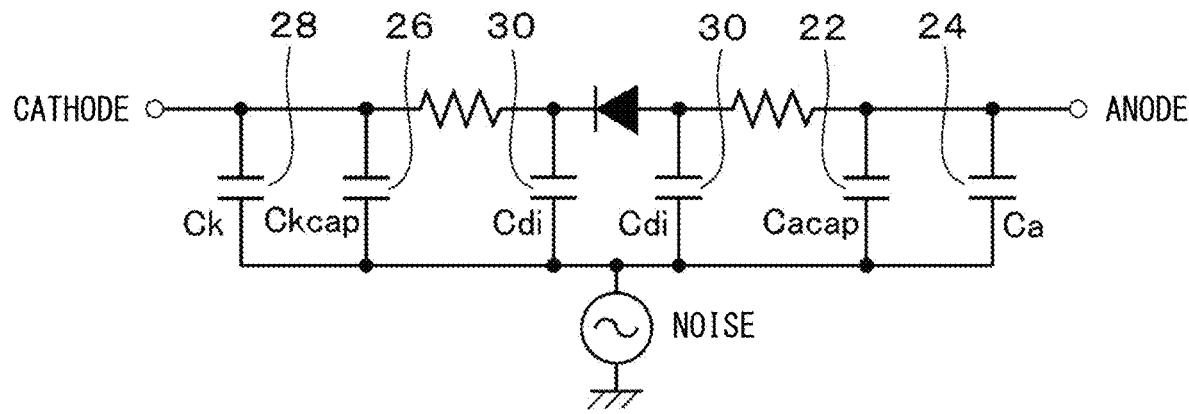
FIG. 2 is a circuit diagram showing a schematic equivalent circuit of the temperature detecting element of the semiconductor device according to the first embodiment.
Figure 3:
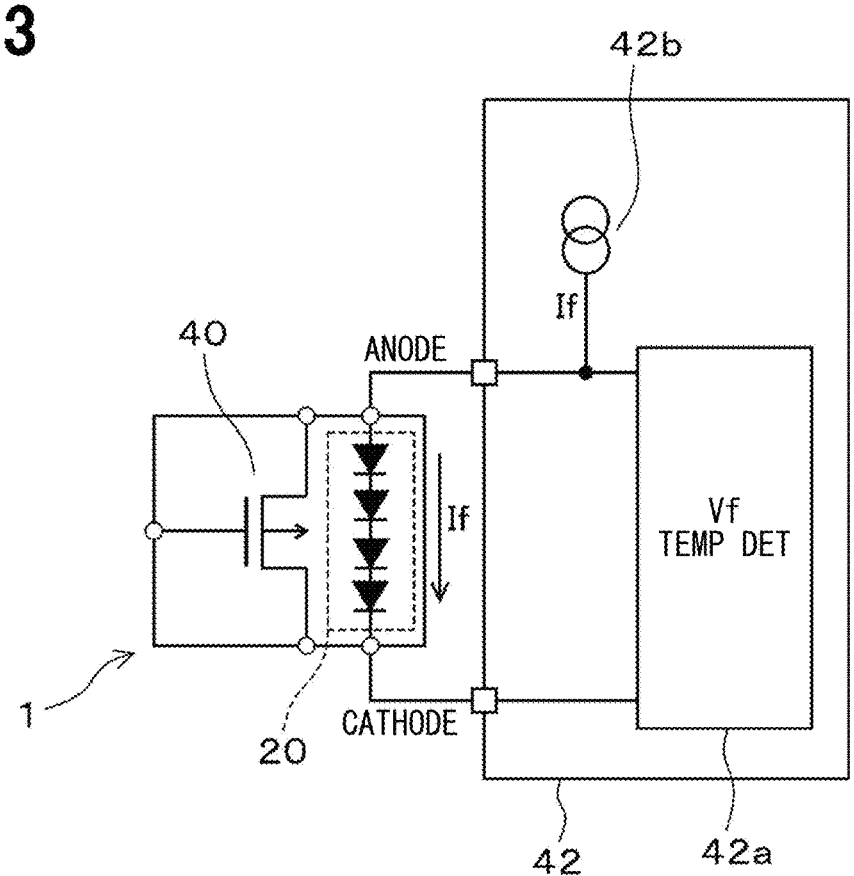
FIG. 3 is a block diagram showing a schematic configuration of a Vf detecting circuit.

As shown in FIGS. 1 to 3, a semiconductor device 1 includes a temperature detecting element 20 and a switching element 40. In FIG. 1, a region located on an anode side of the temperature detecting element 20 is referred to as an anode side region A, and a region located on a cathode side of the temperature detecting element 20 is referred to as a cathode side region K. The semiconductor device 1 is connected to a Vg measuring device 42. In the present embodiment, the temperature detecting element 20 is a temperature sensitive diode formed of a plurality of pn junction diodes. Vf is the forward voltage of the diodes 201 to 204 forming the temperature detecting element 20.

As shown in FIG. 3, the semiconductor device 1 includes the temperature detecting element 20 and the switching element 40, and is connected to the Vf measuring device 42. The Vf measuring device 42 is connected to the anode and cathode of the temperature detecting element 20. The Vf measuring device 42 measures Vf of the temperature detecting element 20.

The Vf measuring device 42 includes a Vf temperature detecting unit (Vf TEMP DET) 42a and a constant current supply unit 42b. The Vf measuring device 42 measures the voltage between the anode and the cathode of the temperature detecting element 20, that is, Vf, while applying a constant current supplied from the constant current supply unit 42b between the anode and the cathode of the temperature detecting element 20. The Vf value is obtained, for example, by supplying a constant current of 500 μA to the temperature detecting element 20 by the constant current supply unit 42b and measuring the voltage between the anode and the cathode of the temperature detecting element 20.

The temperature detecting element 20 is formed of, for example, a plurality of diodes. In the present embodiment, an example in which the temperature detecting element 20 is formed of four diodes 201 to 204 is illustrated, but the number of diodes is not limited to four.

The switching element 40 is formed of, for example, a MOS transistor. When the switching element 40 generates heat due to driving, the temperature of the semiconductor device 1 rises, and the temperature of the temperature detecting element 20 also rises. The Vf characteristic fluctuates in accordance with an increase in temperature of the temperature detecting element 20.

The Vf measuring device 42 monitors the Vf value of the temperature detecting element 20 that fluctuates due to the increase in temperature. The Vf measuring device 42 is provided with, for example, a Vf-temperature table (not shown) in advance, and calculates the temperature of the switching element 40 according to the measured Vf.

Next, the switching element 40 is controlled according to the calculated temperature of the switching element 40. For example, when the temperature of the temperature detecting element 20 reaches a predetermined temperature or higher, an operation clock is delayed to suppress heat generation.

If noise enters from a rear surface of a semiconductor substrate 10, the Vf of the temperature detecting element 20 fluctuates, and the Vf temperature detecting unit 42a measures an erroneous Vf value. Accordingly, incorrect control will be implemented with respect to the switching element 40. According to the present embodiment, since the Vf fluctuation due to noise is suppressed, the above-described subject can be solved.

FIG. 1 shows a configuration of the temperature detecting element 20 including the anode side region A and the cathode side region K, and FIG. 2 shows the equivalent circuit of FIG. 1. As shown in FIG. 1, the temperature detecting element 20 includes an element isolation insulating film 12 provided on the semiconductor substrate 10, a first interlayer insulating film 14 provided on the element isolation insulating film 12, and a second interlayer insulating film 16. The element isolation insulating film 12, the first interlayer insulating film 14 provided on the element isolation insulating film 12, and the second interlayer insulating film 16 are insulating films provided above the semiconductor substrate 10. The semiconductor substrate 10 includes a low-concentration impurity region 10a and a high-concentration impurity region 10b from a side close to a semiconductor substrate surface 10c.

For the semiconductor substrate 10, for example, an n-type single crystal silicon substrate can be used. The semiconductor substrate 10 includes the low-concentration impurity region 10a and the high-concentration impurity region 10b. The low-concentration impurity region 10a and the high-concentration impurity region 10b are formed by, for example, introduction of impurities by implantation of high-energy ions and heat treatment. The low-concentration impurity region 10a and the high-concentration impurity region 10b are n-type impurity regions, and as the impurities to be introduced, for example, phosphorus or arsenic can be used.

The element isolation insulating film 12 is formed of, for example, a silicon oxide film formed by applying a local oxidation of silicon (LOCOS) method, which is a local oxidation method, to the semiconductor substrate 10. The first interlayer insulating film 14 and the second interlayer insulating film 16 are formed by, for example, a chemical vapor deposition (CVD) method, and are formed by, for example, a thermal decomposition method using tetraethyl orthosilicate (TEOS) as a source gas, and is formed of a silicon oxide film in which phosphorus and boron are introduced during film formation. On the rear surface of the semiconductor substrate 10, a rear surface electrode 18 is disposed, and a substrate potential is applied via the rear surface electrode 18. Noise may be input from the rear surface electrode 18.

The temperature detecting element 20 is formed on the first interlayer insulating film 14. The temperature detecting element 20 is formed of, for example, the diodes 201, 202, 203, and 204, each of which is formed of a pair of p+diffusion layer and n+diffusion layer. The diodes 201 to 204 are connected in series by connection electrodes 205, 206 and 207.

Each of the diodes 201 to 204 is formed of, for example, a p+diffusion layer and an n+diffusion layer formed by introducing impurities into silicon. The silicon forming the diodes 201 to 204 is formed of, for example, polysilicon prepared by heat-treating amorphous silicon formed by a CVD method. The p+diffusion layer and n+diffusion layer are examples of a semiconductor layer forming the temperature detecting element 20.

The p+diffusion layers and n+diffusion layers of the diodes 201 to 204 are formed by introducing impurities such as phosphorus, arsenic, and boron into polysilicon by, for example, an ion implantation method, using a photoresist formed by a lithography method as a mask. For example, boron is introduced into the p+diffusion layers, and phosphorus, arsenic, or the like is introduced into the n+diffusion layers.

The p+diffusion layers and the n+diffusion layers are formed adjacent to each other to form the pn junctions forming the diodes 201-204. In FIG. 1, the diodes 201 to 204 are arranged in this order from the anode side, that is, the side close to the anode side region A. In each of the diodes 201 to 204, the p+diffusion layer is arranged close to the anode side region A, and the n+diffusion layer is arranged close to the cathode side region K.

Capacitance electrodes 22a and 26a forming an anode capacitance 22 and a cathode capacitance 26, which will be described later, are made of the same layer of polysilicon formed in the same process as the diodes 201 to 204. In other words, the capacitance electrodes 22a and 26a are formed of semiconductor layers located in the same layers as the semiconductor layer forming the temperature detecting element 20. The anode capacitance 22 and the cathode capacitance 26 are first capacitance elements. Between the temperature detecting element 20 formed of the diodes 201 to 204 and the rear surface electrode 18, an under-diode capacitance 30 is formed. The capacitance value of the under-diode capacitance 30 is defined as a capacitance value Cdi.

In FIG. 1, the anode capacitance 22, an anode pad capacitance 24, the cathode capacitance 26, and a cathode pad capacitance 28 are formed on both sides of the temperature detecting element 20. The anode capacitance 22, the anode pad capacitance 24, the cathode capacitance 26, and the cathode pad capacitance 28 are capacitance elements. The anode pad capacitance 24 and the cathode pad capacitance 28 are second capacitance elements.

A first wiring 208 connected to the anode side of the temperature detecting element 20 is formed adjacent to the p+diffusion layer of the diode 201, and connects the diode 201 and the capacitance electrode 22a. A second wiring 209 connected to the cathode side of the temperature detecting element 20 is formed adjacent to the n+diffusion layer of the diode 204, and connects the diode 204 and the capacitance electrode 26a.

The capacitance electrode 22a and the capacitance electrode 26a are formed on the first interlayer insulating film 14. The capacitance electrodes 22a and 26a are made of polysilicon formed at the same time as the diodes 201 to 204. The capacitance electrodes 22a and 26a are formed into n−impurity regions, for example, by introducing phosphorus at a low concentration.

The anode capacitance 22 is formed between the capacitance electrode 22a and the rear surface electrode 18. The capacitance value of the anode capacitance 22 is defined as a capacitance value Capap. The cathode capacitance 26 is formed between the capacitance electrode 26a and the rear surface electrode 18. The capacitance value of the cathode capacitance 26 is defined as a capacitance value Ckcap.

An anode pad 24a and a cathode pad 28a are formed on the second interlayer insulating film 16. The anode pad 24a and the cathode pad 28a forming the anode pad capacitance 24 and the cathode pad capacitance 28, respectively, are made of metal, for example, aluminum. The anode pad 24a and the cathode pad 28a are electrode pads.

Between the anode pad 24a and the cathode pad 28a and the semiconductor substrate 10, the element isolation insulating film 12, the first interlayer insulating film 14, and the second interlayer insulating film 16 are narrowly interposed from a side close to the semiconductor substrate 10. The anode pad 24a and the cathode pad 28a are formed in a flat plate rectangular shape, for example. The area of either one of the anode pad 24a and the cathode pad 28a is formed to be larger than the area of the other. In the present embodiment, the anode pad 24a has a larger area than the cathode pad 28a.

The anode pad capacitance 24 is formed between the anode pad 24a and the rear surface electrode 18. The capacitance value of the anode pad capacitance 24 is defined as a capacitance value Ca. The cathode pad capacitance 28 is formed between the cathode pad 28a and the rear surface electrode 18. The capacitance value of the cathode pad capacitance 28 is defined as a capacitance value Ck.

Since the anode pad 24a has the larger area than the cathode pad 28a, the relationship between the capacitance values is that the capacitance value Ca> the capacitance value Ck. Further, the capacitance value of the anode side region A, that is, the sum of the anode capacitance 22 and the anode pad capacitance 24 is set to be larger than the under-diode capacitance 30 of the temperature detecting element 20. In this case, the following expression (1) is established.

$$\text{Capacitance value } Ca + \text{capacitance value } Capap > \text{capacitance value } Cdi \quad (1)$$

As described above, the sum of the capacitance values of the anode capacitance 22 and the anode pad capacitance 24, that is, the capacitance value of the anode side region A, "capacitance value Ca+capacitance value Capap" is larger than the capacitance value Cdi of the temperature detecting element 20. When noise enters the rear surface electrode 18, since the capacitance value of the anode side region A is larger than the capacitance value of the temperature detecting element 20, the noise is predominantly absorbed by the capacitance of the anode side region A, that is, the anode capacitance 22 and the anode pad capacitance 24. As a result, the influence of noise on the temperature detecting element 20 can be reduced, so that it is possible to provide the semiconductor device 1 capable of reducing erroneous operation of the temperature detection element 20 due to noise.

Further, in the present embodiment, when the sum of the anode side capacitance and the cathode side capacitance is larger than the capacitance of the temperature detecting element 20, noise is predominantly absorbed by the anode side capacitance and the cathode side capacitance, that is, the anode capacitance 22, the anode pad capacitance 24, and the cathode capacitance 26, and the cathode pad capacitance 28. As a result, the influence of noise on the temperature detecting element 20 can be reduced, so that it is possible to provide the semiconductor device 1 capable of reducing erroneous operation of the temperature detection element 20 due to noise.

Figure 4:
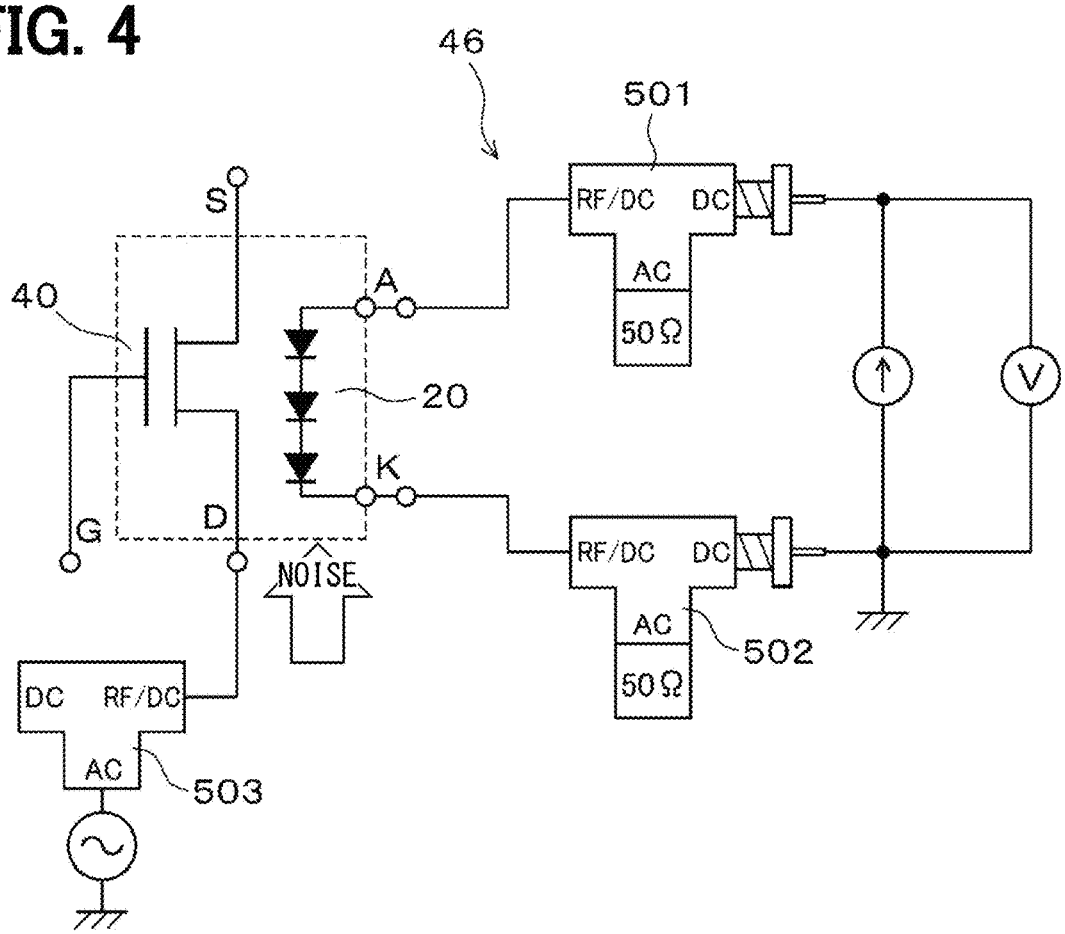
FIG. 4 is a schematic configuration diagram of a DPI test apparatus.

FIG. 4 is a block diagram showing a schematic configuration of a direct power injection method (DPI) test apparatus 46. The DPI test is a test in which noise is directly injected into each terminal of an IC by capacitive coupling and the change amount of Vf of the temperature detecting element 20 is measured. If the change amount of Vf is large, there is a high possibility to cause erroneous operation of the temperature detecting element 20.

As shown in FIG. 4, the anode of the temperature detecting element 20 is connected to an RF/DC terminal of a bias tee 501. The cathode of the temperature detecting element 20 is connected to an RF/DC terminal of a bias tee 502. The bias tees 501 and 502 are connected to a constant current source 48, whereby a constant current is supplied to the temperature detecting element 20.

A drain terminal of the switching element 40 is connected to a bias tee 503, which is a noise source. A constant current source and a voltmeter are connected between the bias tees 501 and 502. The change amount of Vf of the temperature detecting element 20 can be measured using the DPI test apparatus 46.

Figure 5:
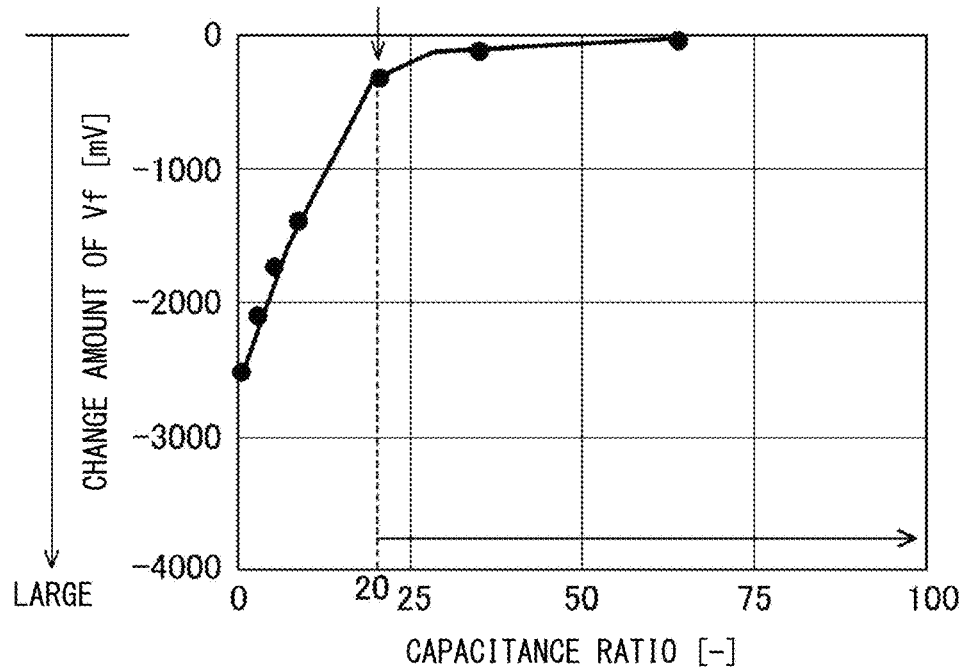
FIG. 5 is a graph showing a capacitance value dependency of a change amount of Vf.

FIG. 5 is a plot of the change amount of Vf with respect to the capacitance ratio of the capacitance value Cdi of the temperature detecting element 20 and the sum of the capacitance value Ca of the anode capacitance 22 and the capacitance value Capap of the anode pad capacitance 24. According to FIG. 5, the change amount of Vf decreases with increase in the capacitance ratio.

Further, there is an inflection point at the capacitance ratio of 20.5, and in a region of the capacitance ratio higher than 20.5, the improvement in the change amount of Vf is not so much seen with respect to the increase in the capacitance ratio. That is, even if the capacitance ratio is set to be 20.5 or more, the effect of reducing the change amount of Vf is reduced. Therefore, the capacitance ratio provided in the anode side region A or the cathode side region K has a large effect of improving the change amount of Vf with respect to the increase in the capacitance ratio up to about 20.5, but when the capacitance ratio is further increased, the improvement in the change amount of Vf with respect to the increase in the capacitance ratio becomes small.

According to the semiconductor device 1 of the first embodiment, the following effects are obtained. In the anode side region A, the sum of the capacitance values of the anode capacitance 22 formed of the capacitance electrode 22a and the anode pad capacitance 24 formed of the anode pad 24a (capacitance value Ca+capacitance value Capap) is set to be larger than the capacitance value of the under-diode capacitance 30 (capacitance value Cdi) formed between the temperature detecting element 20 and the semiconductor substrate 10. That is, the impedance directly under the anode side region A is smaller than the impedance directly under the temperature detecting element 20. Accordingly, noise input to the temperature detecting element 20 can be reduced.

In the present embodiment, since the area of the capacitance electrode 22a is set to be larger than the area of the capacitance electrode 26a, the capacitance value is large. That is, the impedance directly under the anode side region A is smaller than the impedance directly under the temperature detecting element 20. Further, the area of the anode pad 24a is set to be larger than the area of the cathode pad 28a. Accordingly, noise input to the temperature detecting element 20 can be reduced.

Further, at this time, even if the capacitance ratio of the capacitance value Cdi of the temperature detecting element 20 and the sum of the capacitance value Ca of the anode capacitance 22 and the capacitance value Capap of the anode pad capacitance 24 is set to 20.5 or more, the effect of reducing the change amount of Vf is not improved significantly. That is, a sufficiently effective capacitance ratio can be obtained when the capacitance ratio is 20.5 or more, and it is not necessary to further increase the capacitance ratio.

In the first embodiment, an example in which the capacitance value of the anode side region A is set to be large has been described, but the capacitance value of the cathode side region K may be set to be large. In this case, in the cathode side region K, the sum of the capacitance values of the cathode capacitance 26 formed of the capacitance electrode 26a and the cathode pad capacitance 28 formed of the cathode pad 28a (capacitance value Ck+capacitance value Ckcap) is set to be larger than the capacitance value of the under-diode capacitance 30 (capacitance value Cdi) formed between the temperature detecting element 20 and the semiconductor substrate 10. That is, the impedance directly under the cathode side region K is smaller than the impedance directly under the temperature detecting element 20. Here, capacitance value Ca<capacitance value Ck is established. Further, the following expression (2) is established.

$$\text{Capacitance value } Ck + \text{capacitance value } Ckcap > \text{capacitance value } Cdi \quad (2)$$

Even in this case, the same effect is obtained.

Second Embodiment

Figure 6:
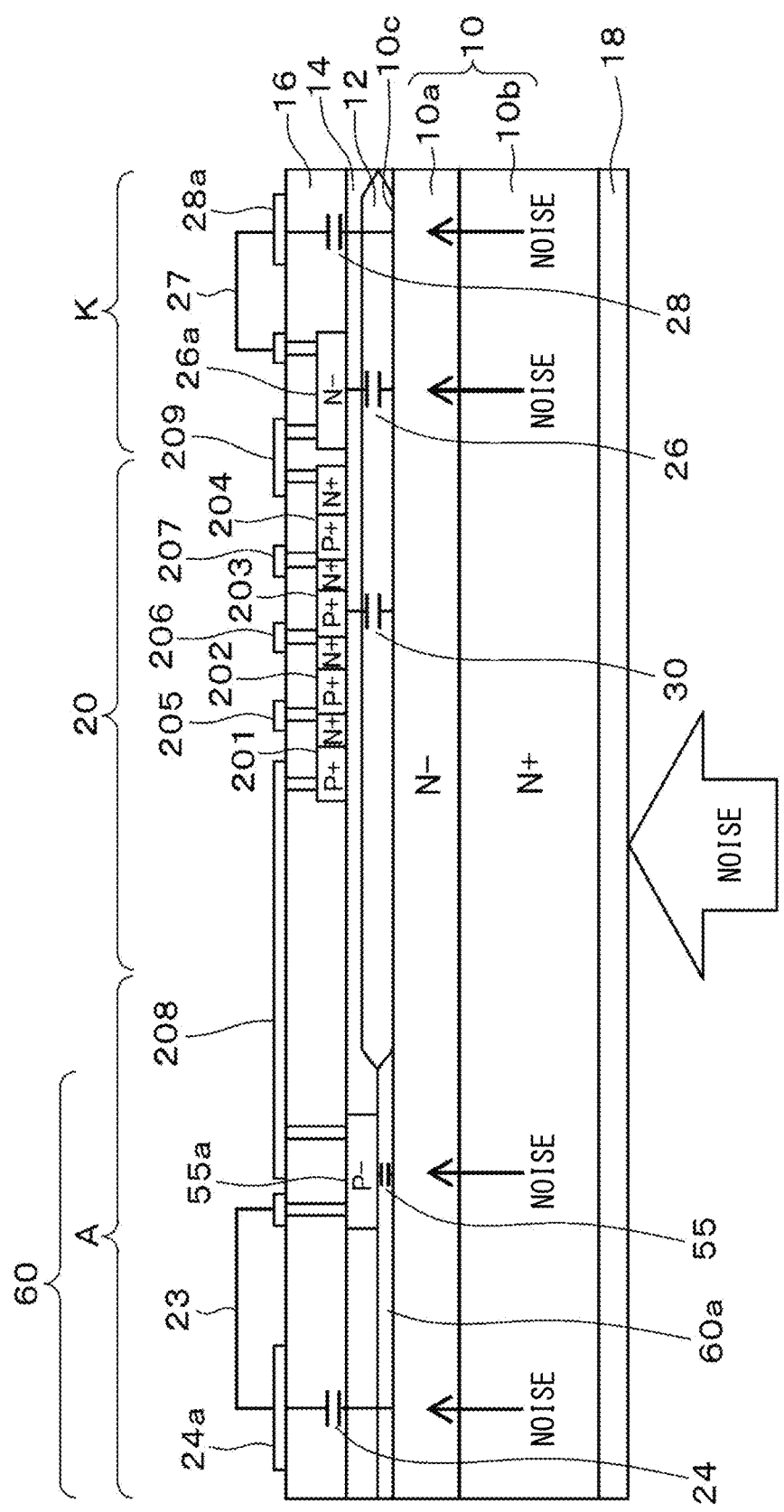
FIG. 6 is a vertical cross-sectional view showing a schematic configuration of a temperature detecting element of a semiconductor device according to a second embodiment.
Figure 7:
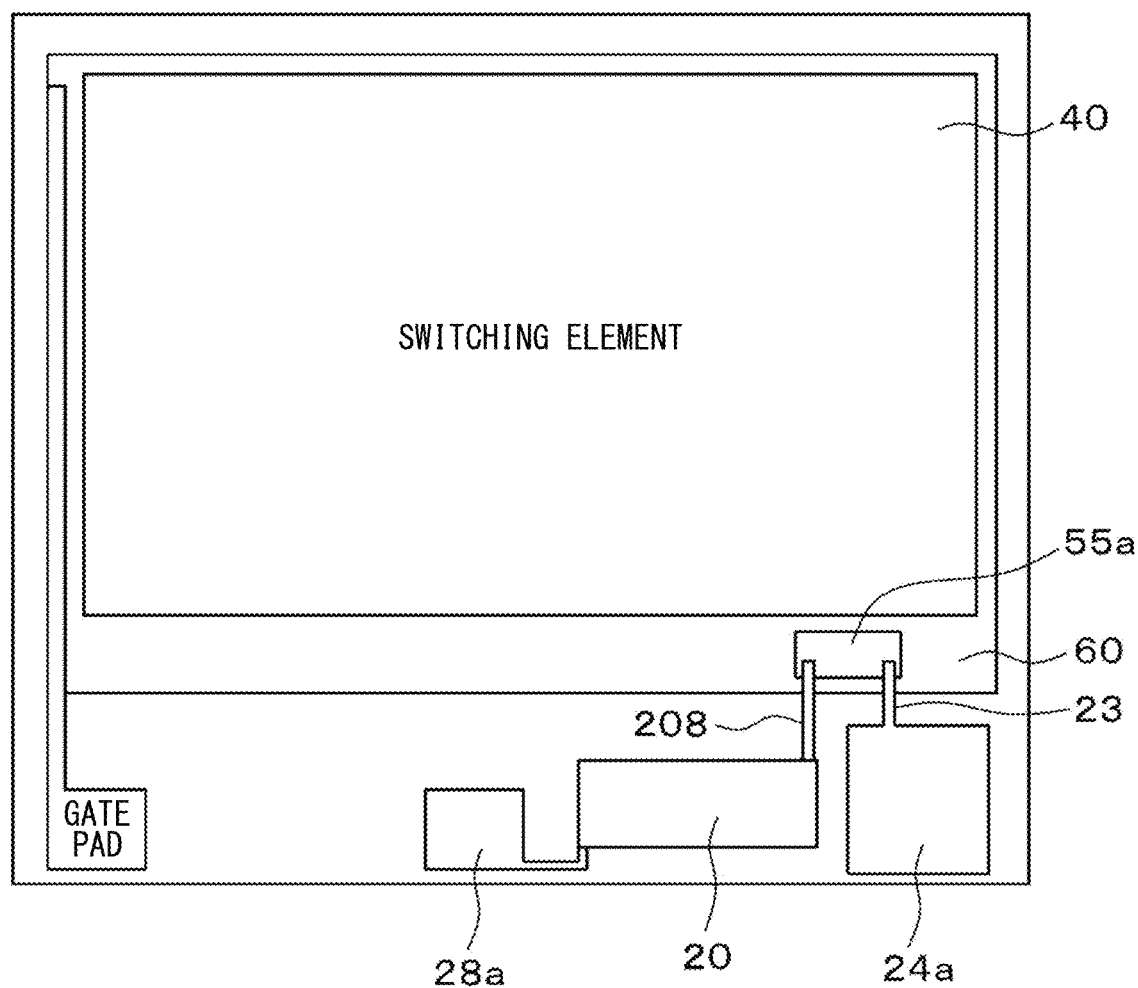
FIG. 7 is a plan view showing a schematic configuration of a layout example of the temperature detecting element.

Next, a semiconductor device 1 according to a second embodiment will be described. As shown in FIGS. 6 and 7, in the second embodiment, an anode capacitance 55 in the anode side region A is formed in an active region 60. More specifically, a capacitance electrode 55a forming the anode capacitance 55 is formed on an oxide film 60a in the active region 60.

The oxide film 60a in the active region 60 is formed as, for example, a gate oxide film of a MOS transistor formed in the active region 60, and has a very thin film thickness. Therefore, since the anode capacitance 55 is formed between the capacitance electrode 55a and the semiconductor substrate 10 via the oxide film 60a, which is thin, the capacitance value can be increased. That is, the impedance directly under the anode side region A is smaller than the impedance directly under the temperature detecting element 20.

According to the semiconductor device 1 of the second embodiment, effects similar to the effects of the first embodiment can be obtained. Further, according to the semiconductor device 1 of the second embodiment, since the capacitance value of the anode capacitance 55 can be further increased, the effects can be further improved than the first embodiment.

Third Embodiment

Figure 8:
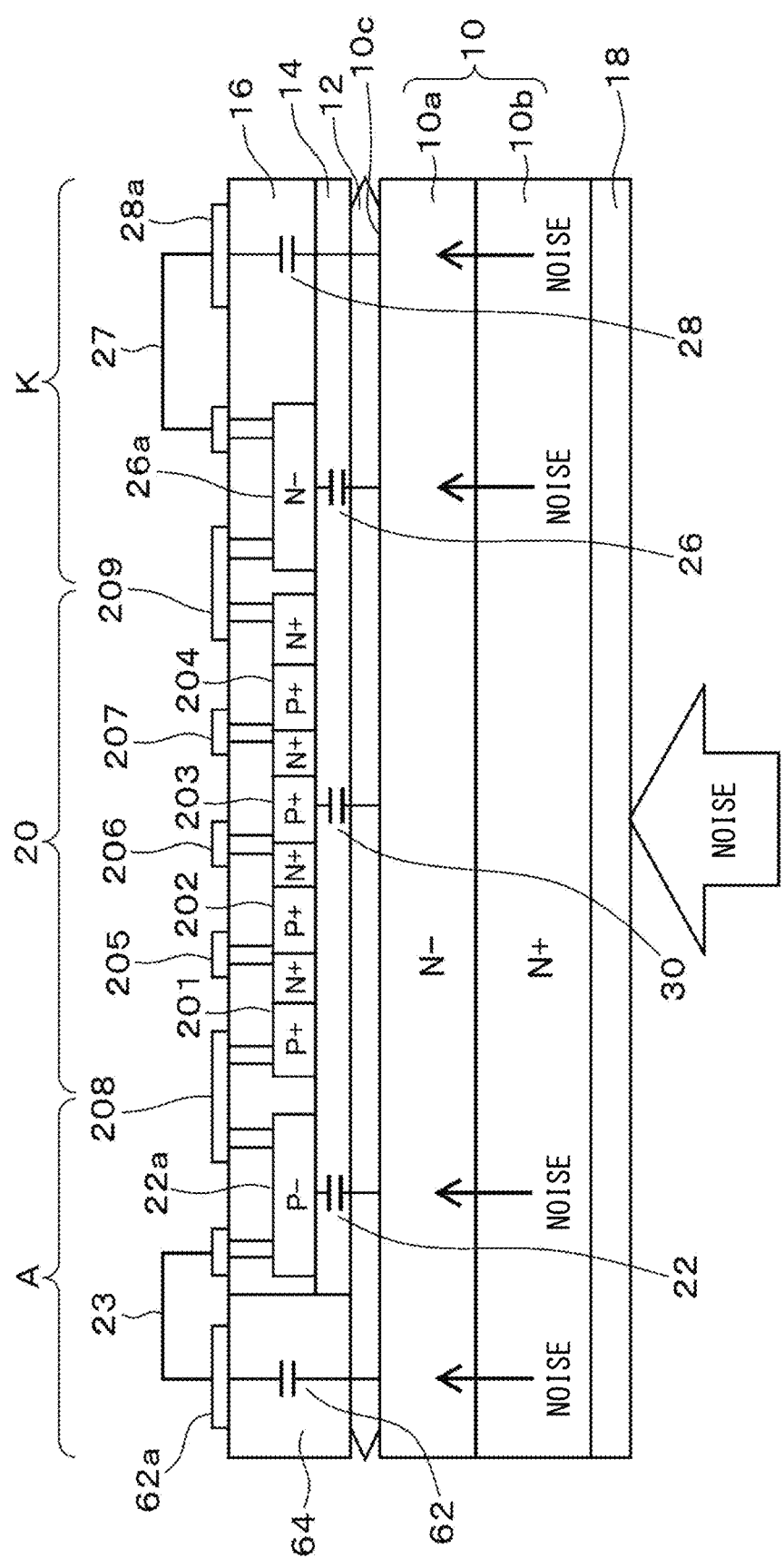
FIG. 8 is a vertical cross-sectional view showing a schematic configuration of a temperature detecting element of a semiconductor device according to a third embodiment.

Next, a semiconductor device 1 according to a third embodiment will be described. As shown in FIG. 8, in the third embodiment, in an anode pad capacitance 62 in the anode side region A, a high-dielectric substance 64 is provided as an insulator formed between an anode pad 62a and the element isolation insulating film 12. Therefore, since the high-dielectric substance 64 having a high dielectric constant is narrowly interposed between the anode pad 62a and the semiconductor substrate 10, the capacitance value of the anode pad capacitance 62 can be increased.

According to the semiconductor device 1 of the third embodiment, effects similar to the effects of the first embodiment can be obtained. Further, according to the semiconductor device 1 of the third embodiment, the capacitance value of the anode pad capacitance 62 can be further increased. That is, the impedance directly under the anode side region A is smaller than the impedance directly under the temperature detecting element 20. Therefore, the effects can be further improved than the first embodiment.

Fourth Embodiment

Figure 9:
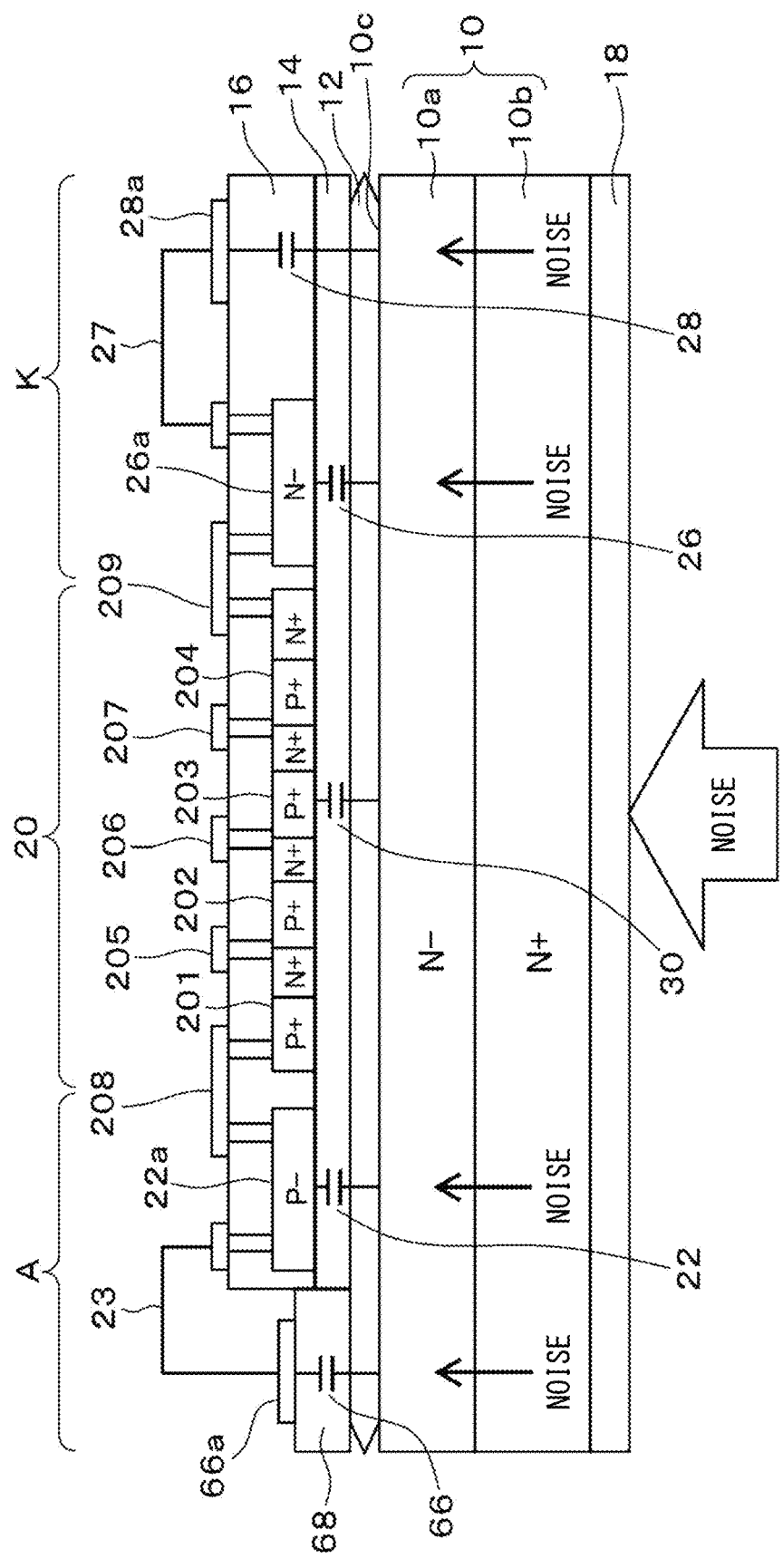
FIG. 9 is a vertical cross-sectional view showing a schematic configuration of a temperature detecting element of a semiconductor device according to a fourth embodiment.

Next, a semiconductor device 1 according to a fourth embodiment will be described. As shown in FIG. 9, in the fourth embodiment, a film thickness of an oxide film 68 formed between the anode pad 66a and the element isolation insulating film 12 is reduced in the anode pad capacitance 66 in the anode side region A. Specifically, the anode pad 66a is disposed above the element isolation insulating film 12. Since the distance between the anode pad 66a and the semiconductor substrate 10 becomes small, the capacitance value of the anode pad capacitance 66 can be increased. That is, the impedance directly under the anode side region A is smaller than the impedance directly under the temperature detecting element 20.

According to the semiconductor device 1 of the fourth embodiment, effects similar to the effects of the first embodiment can be obtained. Further, according to the semiconductor device of the fourth embodiment, since the capacitance value of the anode pad capacitance 66 can be set to be further increased, the effects can be further improved than the first embodiment.

Fifth Embodiment

Next, a semiconductor device 1 according to a fifth embodiment will be described. In the fifth embodiment, as shown in FIG. 10, in the semiconductor substrate 10 under the capacitance electrode 22a and the anode pad 24a, which are in the anode side region A, and under the capacitance electrode 26a and the cathode pad 28a, which are in the cathode side region K, high-concentration (HIGH CONC) impurity regions 70 and 72 are formed instead of the low concentration impurity region 10a formed in the first embodiment.

In the present embodiment, the high-concentration impurity regions 70 and 72 are provided as high-concentration n-type regions. Therefore, in the semiconductor substrate 10 under the capacitance electrode 22a and the anode pad 24a, which are in the anode side region A, and under the capacitance electrode 26a and the cathode pad 28a, which are in the cathode side region K, the high-concentration impurity region 10b and the high-concentration impurity regions 70 and 72 are provided from the rear surface side.

Further, in the semiconductor device 1 according to the fifth embodiment, a low-concentration impurity region 74 is provided under the temperature detecting element 20. In the present embodiment, the low-concentration impurity region 74 is provided as a low-concentration n-type region.

In the above configuration, the high concentration impurity regions 70, 72 and the concentration impurity region 10b are provided in the semiconductor substrate 10 under the capacitance electrode 22a and the anode pad 24a, which are in the anode side region A, and under the capacitance electrode 26a and the cathode pad 28a, which are in the cathode side region K, while the low concentration impurity region 74 and the high concentration impurity region 10b are provided in the semiconductor substrate 10 under the temperature detecting element 20.

Therefore, the electric resistance of the semiconductor substrate 10 under the capacitance electrode 22a and the anode pad 24a, which are in the anode side region A, and under the capacitance electrode 26a and the cathode pad 28a, which are in the cathode side region K, is set to be low compared with the electric resistance of the semiconductor substrate 10 under the temperature detecting element 20. That is, the impedances directly under the anode side region A and the cathode side region K are smaller than the impedance directly under the temperature detecting element 20.

According to this configuration, noise that has entered from the rear surface of the semiconductor substrate 10 propagates to the side with the smaller resistance, that is, the side with the smaller impedance, so that noise is more likely to propagate to the anode side region A or the cathode side region K than the temperature detecting element 20. Therefore, when noise enters from the rear surface of the semiconductor substrate 10, the propagation of the noise to the temperature detecting element 20 can be suppressed. Therefore, effects similar to the first embodiment can be further improved.

Although the present disclosure has been made in accordance with the embodiments, it is understood that the present disclosure is not limited to such embodiments and structures. The present disclosure encompasses various modifications and variations within the scope of equivalents. Furthermore, various combinations and aspects, and other combination and aspect including only one element, more than one element or less than one element, are also within the sprit and scope of the present disclosure.

The above-described embodiments have described examples in which a means of increasing the capacitance and reducing the resistance is used as a means of lowering the impedance, but the means of lowering the impedance is not limited to such a means in a range not deviating from the scope of the present disclosure.

What is claimed is:

1. A semiconductor device comprising:
a semiconductor substrate;
an insulating film disposed above the semiconductor substrate;
a temperature detecting element, comprising a plurality of diodes, disposed on the insulating film;
a capacitance electrode disposed on the insulating film and physically separated from the temperature detecting element; and
an electrode pad connected with the capacitance electrode and physically separated from the temperature detecting element, wherein
the capacitance electrode and the electrode pad are disposed in at least one of an anode side region and a cathode side region, the anode side region located on an anode side of the temperature detecting element and the cathode side region located on a cathode side of the temperature detecting element,
a first capacitance element is formed between the capacitance electrode and the semiconductor substrate, and a second capacitance element is formed between the electrode pad and the semiconductor substrate, and
a sum of capacitance values of the first capacitance element and the second capacitance element is larger than a capacitance value of a capacitance element formed between the temperature detecting element and the semiconductor substrate.

2. The semiconductor device according to claim 1, wherein
the capacitance electrode and the electrode pad are disposed in both of the anode side region and the cathode side region, and
the electrode pad in one of the anode side region and the cathode side region has an area larger than an area of the electrode pad in the other of the anode side region and the cathode side region.

3. The semiconductor device according to claim 1, wherein
the capacitance electrode and the electrode pad are disposed at least in the anode side region.

4. A semiconductor device comprising:
a semiconductor substrate;

an insulating film disposed above the semiconductor substrate;
a temperature detecting element, comprising a plurality of diodes, disposed on the insulating film;
a capacitance electrode disposed on the insulating film and physically separated from the temperature detecting element; and
an electrode pad connected with the capacitance electrode and physically separated from the temperature detecting element, wherein
the capacitance electrode and the electrode pad are disposed in at least one of an anode side region and a cathode side region, the anode side region located on an anode side of the temperature detecting element and the cathode side region located on a cathode side of the temperature detecting element, and
a combined capacitor impedance of (i) a capacitor impedance formed between the capacitance electrode and the semiconductor substrate and Ea a capacitor impedance formed between the electrode pad and the semiconductor substrate is smaller than a capacitor impedance formed between the temperature detecting element and the semiconductor substrate.

* * * * *